United States Patent
Yeh et al.

(10) Patent No.: US 12,062,590 B2
(45) Date of Patent: Aug. 13, 2024

(54) METHOD FOR MANUFACTURING SEMICONDUCTOR PACKAGE STRUCTURE

(71) Applicant: TAIWAN SEMICONDUCTOR MANUFACTURING COMPANY LTD., Hsinchu (TW)

(72) Inventors: Ting-Yu Yeh, Hsinchu (TW); Chia-Hao Hsu, Hsinchu (TW); Weiming Chris Chen, Taipei (TW); Kuo-Chiang Ting, Hsinchu (TW); Tu-Hao Yu, Hsin-Chu (TW); Shang-Yun Hou, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 728 days.

(21) Appl. No.: 16/725,189

(22) Filed: Dec. 23, 2019

(65) Prior Publication Data
US 2020/0144155 A1    May 7, 2020

Related U.S. Application Data

(62) Division of application No. 15/992,045, filed on May 29, 2018, now Pat. No. 10,515,869.

(51) Int. Cl.
| | |
|---|---|
| *H01L 23/373* | (2006.01) |
| *H01L 21/66* | (2006.01) |
| *H01L 23/00* | (2006.01) |
| *H01L 27/06* | (2006.01) |

(52) U.S. Cl.
CPC .......... *H01L 23/3735* (2013.01); *H01L 22/32* (2013.01); *H01L 23/562* (2013.01); *H01L 24/17* (2013.01); *H01L 27/0688* (2013.01); *H01L 2924/3511* (2013.01); *H01L 2924/3512* (2013.01)

(58) Field of Classification Search
None
See application file for complete search history.

(56) References Cited

U.S. PATENT DOCUMENTS

| | | | | |
|---|---|---|---|---|
| 5,587,882 A | * | 12/1996 | Patel | H01L 25/0655 257/713 |
| 5,604,978 A | * | 2/1997 | Sherif | H01L 25/0655 361/705 |
| 5,757,620 A | * | 5/1998 | Edwards | H01L 25/0655 257/713 |
| 6,212,074 B1 | * | 4/2001 | Gonsalves | H01L 23/4275 174/16.3 |

(Continued)

*Primary Examiner* — Erik T. K. Peterson
(74) *Attorney, Agent, or Firm* — WPAT LAW; Anthony King

(57) ABSTRACT

A semiconductor package structure includes a substrate, a first semiconductor and a second semiconductor over the substrate, and a multi-TIM structure disposed over the first semiconductor die and the second semiconductor die. The first semiconductor die includes a first heat output and the second semiconductor die includes a second heat output less than the first heat output. The multi-TIM structure includes a first TIM layer disposed over at least a portion of the first semiconductor die and a second TIM layer. A thermal conductivity of the first TIM layer is higher than a thermal conductivity of the second TIM layer. The first TIM layer covers the first semiconductor die.

20 Claims, 11 Drawing Sheets

(56) References Cited

U.S. PATENT DOCUMENTS

| | | | |
|---|---|---|---|
| 7,843,058 B2 | 11/2010 | Tsao et al. | |
| 8,202,765 B2 | 6/2012 | Casey et al. | |
| 8,779,582 B2 | 7/2014 | Lin et al. | |
| 9,076,754 B2 | 7/2015 | Hung et al. | |
| 2004/0217467 A1 | 11/2004 | Rumer et al. | |
| 2005/0068739 A1* | 3/2005 | Arvelo | H01L 23/3675 |
| | | | 257/E23.09 |
| 2006/0038281 A1* | 2/2006 | Colgan | H01L 25/0655 |
| | | | 257/E23.101 |
| 2006/0044772 A1* | 3/2006 | Miura | H01L 25/072 |
| | | | 257/E23.101 |
| 2008/0237841 A1* | 10/2008 | Arana | H01L 23/433 |
| | | | 257/E23.11 |
| 2010/0181665 A1* | 7/2010 | Casey | H01L 23/433 |
| | | | 257/723 |
| 2014/0061893 A1* | 3/2014 | Saeidi | H01L 23/562 |
| | | | 438/122 |
| 2017/0186665 A1* | 6/2017 | Choudhury | H01L 23/42 |
| 2018/0374776 A1* | 12/2018 | Liu | H01L 23/3737 |
| 2019/0267306 A1* | 8/2019 | Raravikar | H01L 25/0655 |

* cited by examiner

METHOD FOR MANUFACTURING SEMICONDUCTOR PACKAGE STRUCTURE

PRIORITY CLAIM AND CROSS-REFERENCE

This patent is a divisional application of U.S. patent application Ser. No. 15/992,045 filed on May 29, 2018, entitled of "SEMICONDUCTOR PACKAGE STRUCTURE HAVING A MULTI-THERMAL INTERFACE MATERIAL STRUCTURE", which is incorporated by reference in its entirety.

BACKGROUND

The semiconductor integrated circuit (IC) industry has experienced rapid growth. Technological advances in IC materials and design have produced generations of ICs where each generation of ICs includes smaller and more complex circuits than those of the previous generation. The smaller and more complex circuits are two-dimensional (2D) in nature, in that the area occupied by the integrated IC's components is on the surface of the semiconductor wafer. However, 2DIC formation faces physical limits. One of these limits is the minimum area needed to accommodate the integrated components. In addition, when more devices are included in one chip or die, more complex designs are required.

To enable further increases in circuit density, three-dimensional integrated circuits (3DIC) have been developed. 3DIC package applications such as package-on-package (PoP) are becoming increasingly popular and widely used in mobile devices because they can enhance electrical performance by integrating logic chips (e.g., application processors (APs)), high capacity/bandwidth memory chips (e.g., wide input/output (WIO) chips, low power double data rate X (LPDDRx) chips, and the like), and/or other heterogeneous chips (e.g., sensors, micro-electro-mechanicals (MEMs), networking devices, and the like), for instance.

During the usage of the package, heat is generated. The heat can cause thermal stress and warpage in the 3DIC package structure leading to cracks in the solder balls. Even with molding compounds in the 3DIC package structure, the problems of excess heat and warpage still cannot be entirely eliminated.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
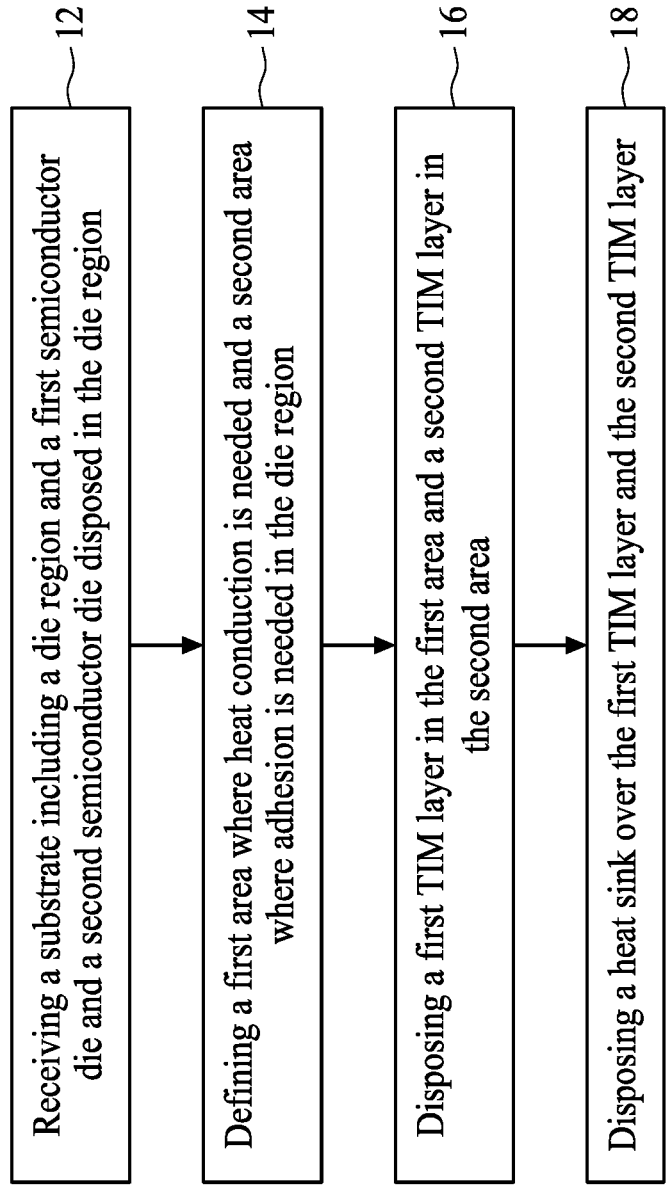
FIG. 1 is a flowchart representing a method for forming a semiconductor package structure according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±4%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±4%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±4°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±4°, less than or equal to ±2°, less than or equal to ±1°, less than or equal to ±0.5°, less than or equal to ±0.1°, or less than or equal to ±0.05°.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In 3DIC, a chip or a package carrying an integrated circuit is commonly mounted on a package carrier, such as a substrate or a circuit board, that provides electrical connections from the chip (also referred to as a die) to the exterior of the package. Heat dissipation is a challenge in 3DIC package structures because it is not easy to efficiently dissipate the heat generated by the dies in an inner or a center region of the 3DIC package structures. In some embodiments, dies such as CPU dies generate more heat than other dies, and thus a temperature in one region may be higher than a temperature in other region. As a result, the heat may be trapped and cause a sharp local temperature peak (sometimes referred to as a hot spot). The hot spot may adversely affect the electrical performance and reliability of the whole 3DIC package structure.

Therefore, heat generated in the device dies during operation needs to be dissipated. In some embodiments, to dissipate the heat, a heat spreader or a heat sink is attached to the dies through a thermal interface material (TIM) layer, which has a high thermal conductivity for effectively dissipating the heat generated by dies into the heat sink. Each TIM can be designed with specific characteristics to meet specific requirements. For example, some TIMs have higher thermal conductivity while others have better adhesion. In some instances, one TIM is selected to meet the thermal requirement at the cost of thermal conductivity. However, since the package structure may include regions having different temperatures, and may therefore suffer from various stresses, different heat dissipation efficiencies and different adhesions are required. It is difficult to have a single TIM layer that meets all requirements.

The present disclosure therefore provides a semiconductor package structure including a multi-TIM structure and a method for forming the same. In some embodiments, the multi-TIM structure includes at least two TIM layers with different thermal conductivities and adhesion properties. In some embodiments, the multi-TIM structure includes different TIM layers depending on the stress applied to the semiconductor package structure. For example, the multi-TIM structure may include a TIM layer having greater adhesion in regions exposed to greater stress and another TIM layer having less adhesion in other regions receiving less stress. In some embodiments, the multi-TIM structure includes different TIM layers depending on heat generated during operation. For example, the multi-TIM structure may include a TIM layer having greater thermal conductivity in regions accommodating dies generating more heat and another TIM layer having less thermal conductivity in regions accommodating dies generating less heat.

FIG. 1 is a method for forming a semiconductor package structure 10 according to aspects of the present disclosure. The method 10 includes an operation 12, receiving a substrate including a die region and a first semiconductor die and a second semiconductor die disposed in the die region. The method 10 includes an operation 14, defining a first area where heat conduction is needed and a second area where adhesion is needed in the die region. The method 10 includes an operation 16, disposing a first TIM layer in the first area and a second TIM layer in the second area. In some embodiments, a thermal conductivity of the first TIM layer is greater than a thermal conductivity of the second TIM layer, and an adhesion of the second TIM layer is greater than an adhesion of the first TIM layer. The method 10 includes an operation 18, disposing a heat sink over the first TIM layer and the second TIM layer. The method 10 will be further described according to one or more embodiments. It should be noted that the operations of the method 10 may be rearranged or otherwise modified within the scope of the various aspects. It should be further be noted that additional processes may be provided before, during, and after the method 10, and that some other processes may only be briefly described herein. Thus, other implementations are possible within the scope of the various aspects described herein.

Figure 2A:
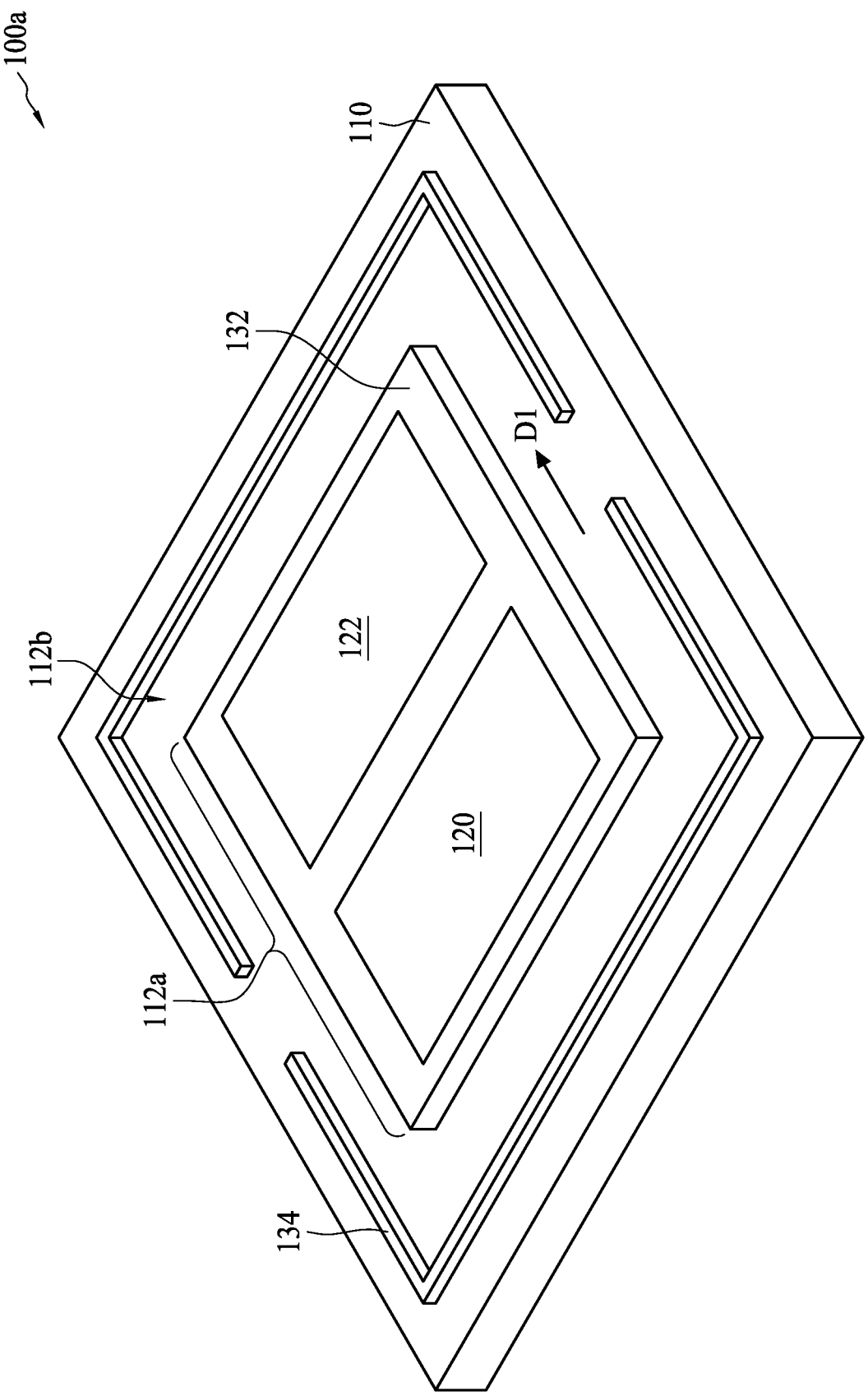
FIGS. 2A to 2D are schematic drawings illustrating a semiconductor package structure at various fabrication stages constructed according to aspects of one or more embodiments of the present disclosure.
Figure 2B:
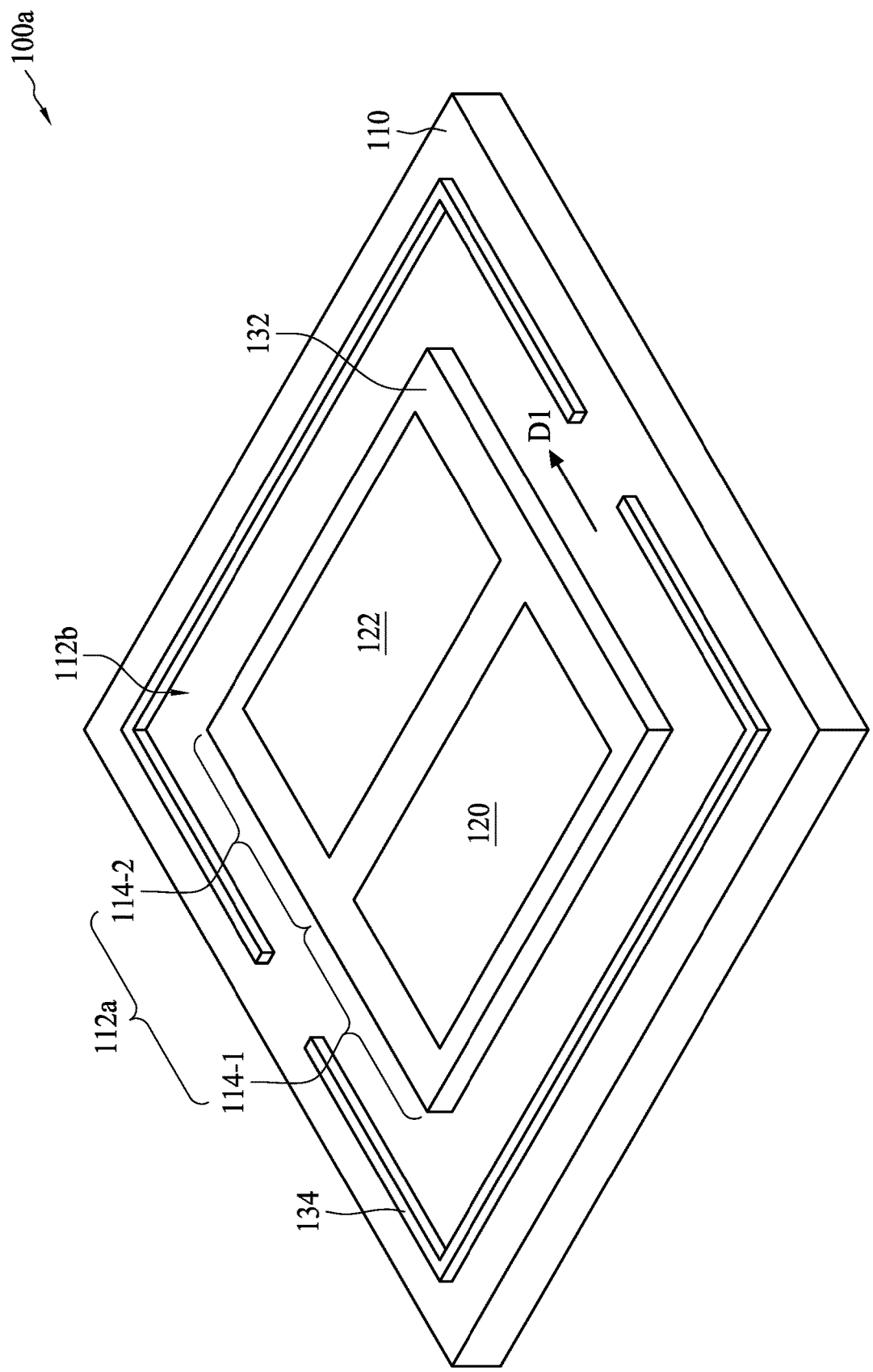
Figure 2C:
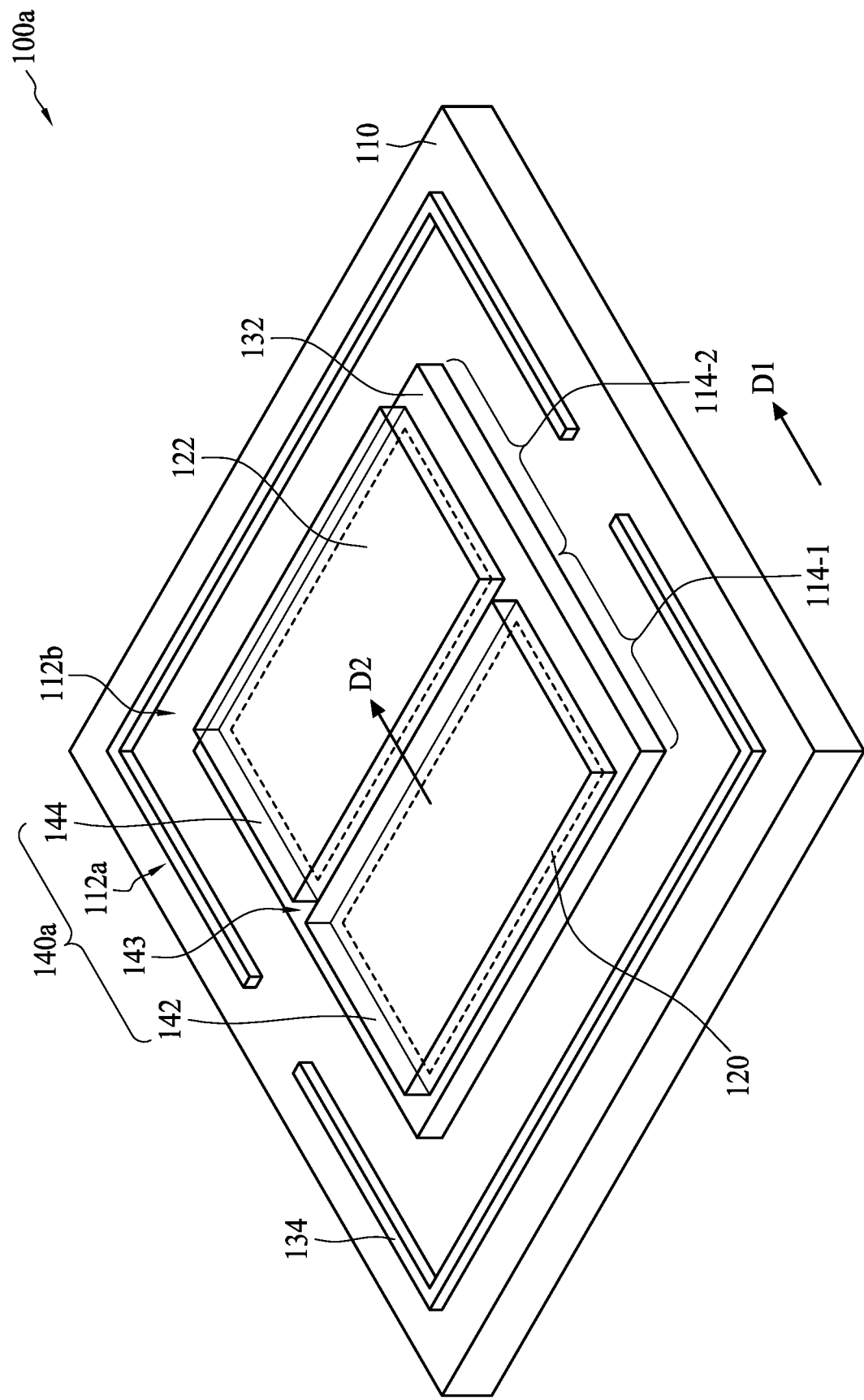
Figure 2D:
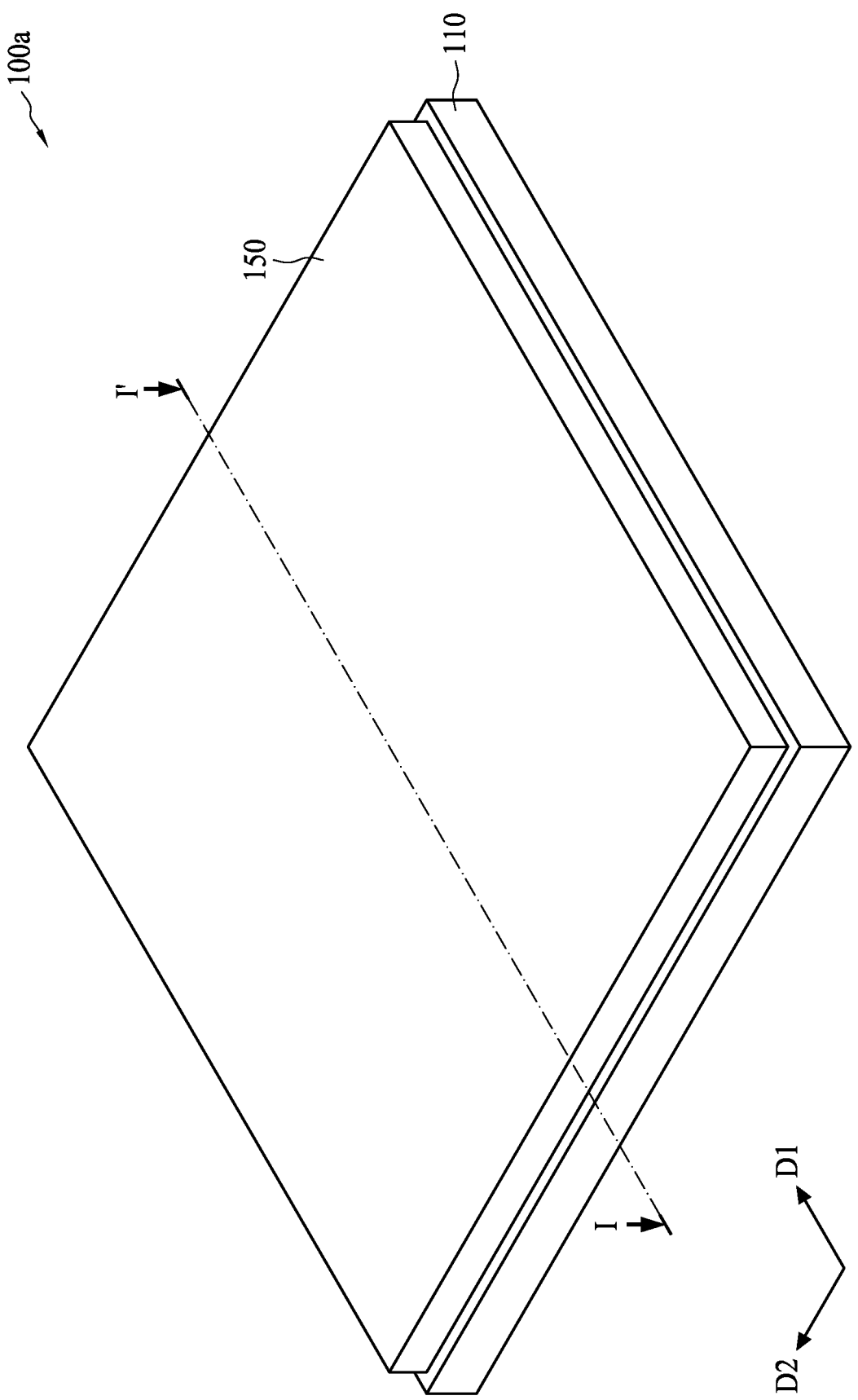
Figure 3:
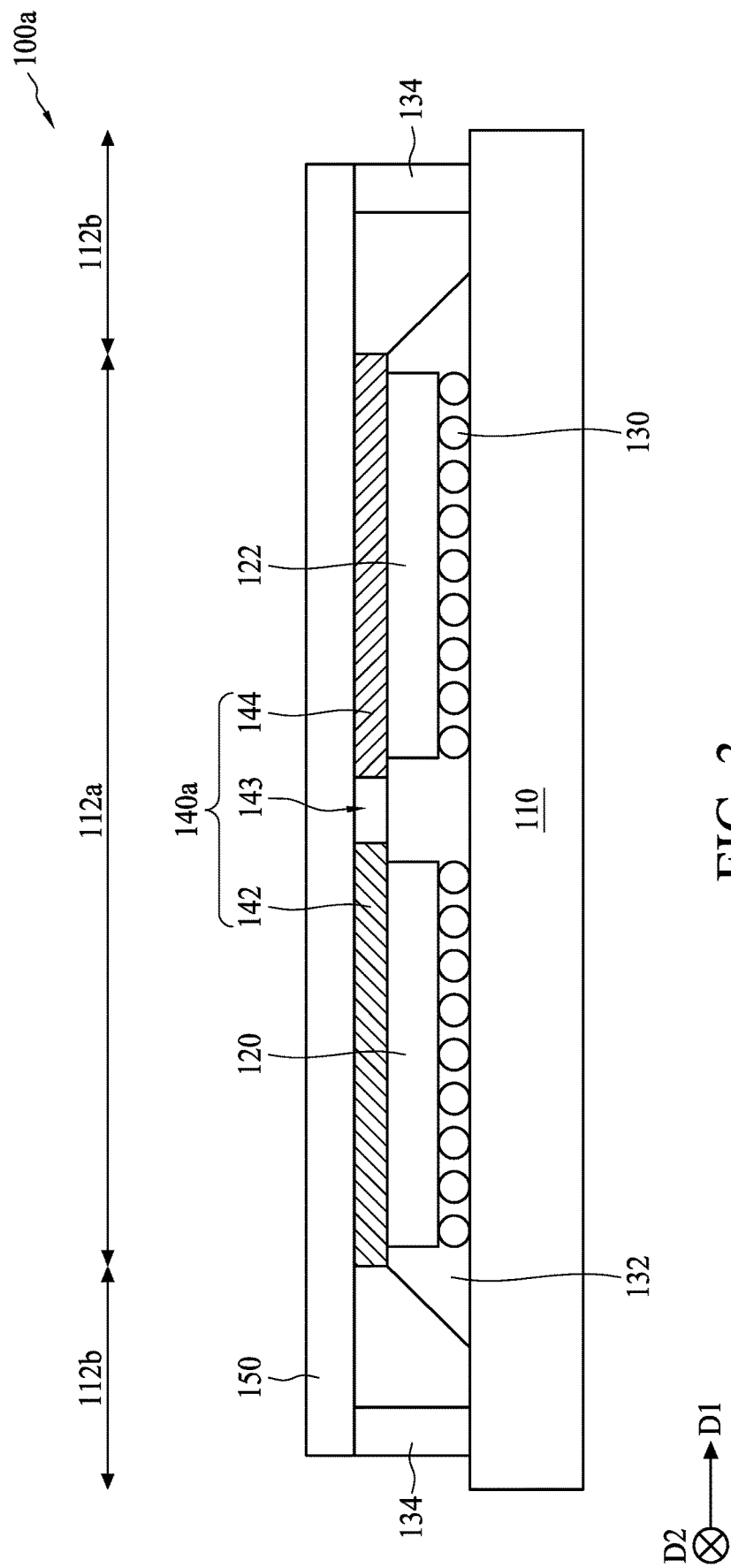
FIG. 3 is a cross-sectional view of a semiconductor package structure according to aspects of one or more embodiments of the present disclosure.
Figure 4:
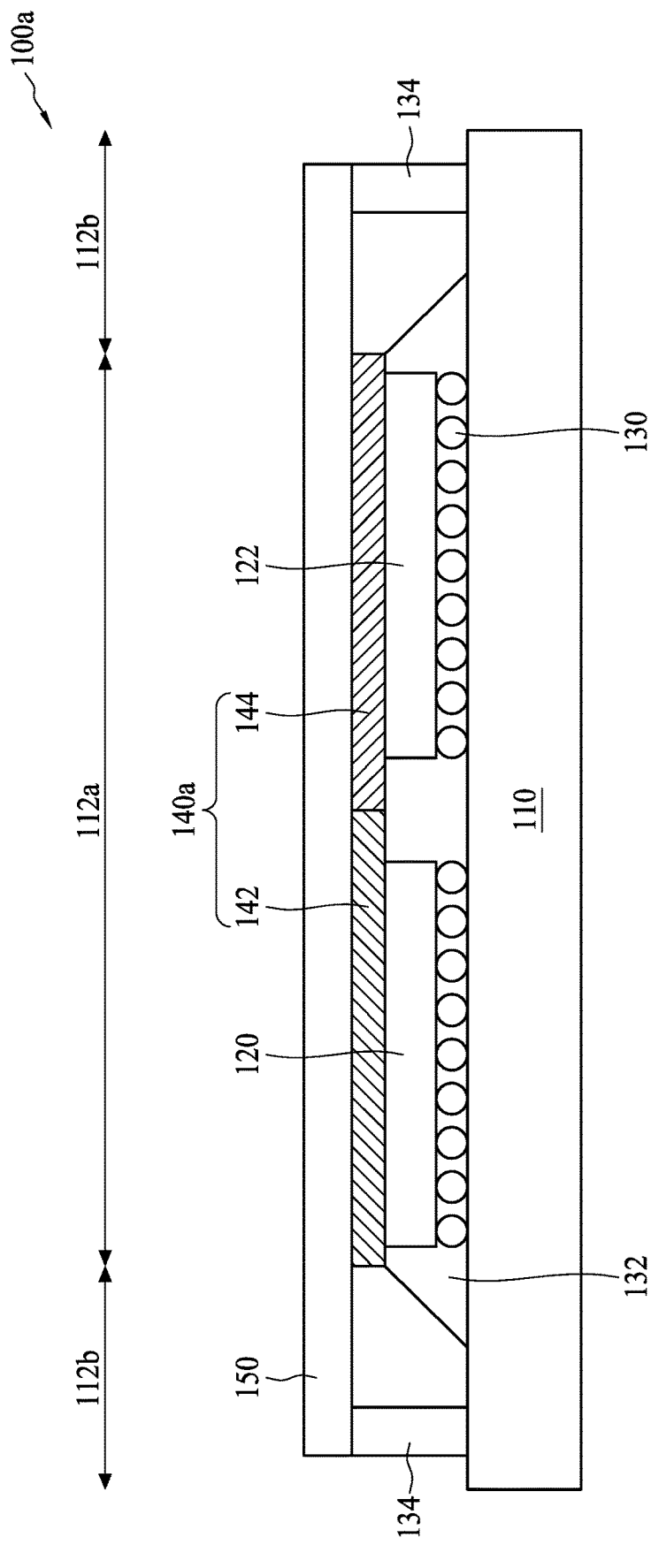
FIG. 4 is a cross-sectional view of a semiconductor package structure according to aspects of one or more embodiments of the present disclosure.

FIGS. 2A to 2D are schematic drawings illustrating a semiconductor package structure 100a at various fabrication stages constructed according to aspects of one or more embodiments of the present disclosure, and FIGS. 3 and 4 are cross-sectional views taken along line I-I' of FIG. 2D. The semiconductor package structure 100a includes a first package. In some embodiments, the first package can be a carrier or a substrate 110 of one or more packages. In some embodiments, the first package is a laminate substrate 110. The laminate substrate 110 may be a plastic substrate or a ceramic substrate. Alternatively, the substrate 110 may be a build-up substrate. In some embodiments, the first substrate 110 includes at least a first region 112a and a second region 112b. The first region 112a is a region defined and configured for accommodating one or more packages or dies, therefore the first region 112a can be referred to as a die region. The first region 112a of the substrate 110 may include a plurality of first bonding pads (not shown) for bonding with the package or die. The second region 112b of the substrate 110 is a region that is not configured for accommodating the packages or dies. In some embodiments, the second region 112b surrounds the first region 112a, as shown in FIG. 1A, but the disclosure is not limited thereto.

Still referring to FIG. 2A, the semiconductor package structure 100a may include a plurality of second packages. In some embodiments, the plurality of second packages can be a plurality of semiconductor dies. In some embodiments, a substrate 110 including a die region 112a and a first semiconductor die 120 and a second semiconductor die 122 disposed in the die region 112a is received, according to operation 12. For example but not limited thereto, at least a first semiconductor die 120 and at least a second semiconductor die 122 are provided in some embodiments. In some embodiments, the first semiconductor die 120 and the second semiconductor die 122 are dies having the same size and function. In some embodiments, the first semiconductor die 120 is different in size compared to the second semiconductor die 122. In some embodiments, the first semiconductor die 120 is different in function compared to the second semiconductor die 122. The first and second semiconductor dies 120 and 122 may each be an integrated circuit (IC) chip, a system on chip (SoC), or a portion thereof. For example, the first semiconductor die 120 can be an application-specific integrated circuit (ASIC) die, an application processing (AP) die, a logic die, which may further be a central processing unit (CPU) die or a graphic processing unit (GPU) die, or the like. The second semiconductor die 122 can be a memory die such as a high bandwidth memory (HBM) die, or the like.

In some embodiments, each of the first and second semiconductor dies 120 and 122 includes a wafer. The wafer may be, for example but not limited thereto, a silicon (Si) wafer. The wafer may alternatively be made of some other suitable elementary semiconductor, such as diamond or germanium (Ge); a suitable compound semiconductor, such as silicon carbide (SiC), indium arsenide (InAs), or indium phosphide (InP); or a suitable alloy semiconductor, such as SiGeC, gallium arsenic phosphide (GaAsP), or GaInP. The wafer may include various doped regions (not shown), isolation structures (not shown), other devices, or a combination thereof. The first and second semiconductor dies 120 and 122 may include various passive and active microelectronic devices such as resistors, capacitors, inductors, diodes, metal-oxide-semiconductor field effect transistors (MOSFETs), complementary metal-oxide-semiconductor (CMOS) devices, bipolar junction transistors (BJTs), laterally diffused MOS (LDMOS) transistors, high power MOS transistors, or other types of transistors. They may include a microelectromechanical system (MEMS) device and/or a nanoelectromechanical system (NEMS) device.

The first and second semiconductor dies 120 and 122 are bonded to the first region 112a of the substrate 110 through a plurality of connectors 130 (shown in FIGS. 3 and 4). In some embodiments, the first and second semiconductor dies 120 and 122 can be flipped upside down such that active surfaces of the first and second semiconductor dies 120 and 122 face the substrate 110 and are bonded to the substrate 110. The first and second semiconductor dies 120 and 122 are bonded by any suitable mechanism. For example, the connectors 130, such as solder balls (also referred to as solder bumps), can be disposed on bonding pads, which are formed on the active surfaces of the first and second semiconductor dies 120 and 122. The connectors 130 are then aligned with and brought into contact with the bonding pads over the substrate 110 to produce electrical coupling between the substrate 110 and the first and second semiconductor dies 120 and 122. Additionally, the first semiconductor die 120 and the second semiconductor 122 can be arranged along a first direction D1, as shown in FIG. 2A, but the disclosure is not limited thereto.

Still referring to FIG. 2A, an underfill 132 is next dispensed or injected into a space between the substrate 110, the first semiconductor die 120 and the second semiconductor die 122. The underfill 132 is injected to fill the space in order to reduce stress exerted on the bonded structures after the bonding. In some embodiments, the underfill 132 can include polymers such as resin epoxy, or other suitable materials. In some embodiments, the underfill 132 can include fillers, such as silica, to adjust the mechanical strength of the underfill 132.

The semiconductor package structure 100a may include adhesive materials 134 disposed in the second region 112b of the substrate 110, as shown in FIG. 2A. In some embodiments, the adhesive materials 134 may include a viscous gel or liquid material, such as thermal grease, silver paste or solder. In some embodiments, supporting elements (not shown) such as spacer or stiffener can be disposed over the substrate 110. In some embodiments, the supporting elements are attached to the substrate 110 by the adhesive material 134.

Referring to FIG. 2B, a first area 114-1 and a second area 114-2 are defined in the first region 112a, that is the die region 112a, according to operation 14. In some embodiments, the first area 114-1 is defined as an area where heat conduction is needed while the second area 114-2 is defined as an area where adhesion is needed. It should be noted that the definition of the first area 114-1 and the second area 114-2 can be modified depending on different product requirements. For example, the first area 114-1 can be defined correspondingly to the first semiconductor die 120, and the second area 114-2 can be defined correspondingly to the second semiconductor die 122 as shown in FIG. 2B, but the disclosure is not limited thereto.

Referring to FIG. 2C, a first TIM layer 142 is disposed in the first area 114-1 and a second TIM layer 144 is disposed in the second area 114-2, according to operation 16. Accordingly, the semiconductor package structure 100a includes a multi-TIM structure 140a disposed over the plurality of semiconductor dies 120 and 122. In some embodiments, the multi-TIM structure 140a includes the first TIM layer 142 and the second TIM layer 144. The first TIM layer 142 and the second TIM layer 144 are arranged in a second direction D2. In some embodiments, the second direction D2 is the same as the first direction D1, as shown in FIG. 2C, but the disclosure is not limited thereto. In some embodiments, the first TIM layer 142 is formed on one of the plurality of semiconductor dies, such as the first semiconductor die 120, while the second TIM layer 144 is formed on another one of the plurality of semiconductor dies, such as the second semiconductor die 122, but the disclosure is not limited thereto.

As shown in FIGS. 2C and 3, in some embodiments, the first TIM layer 142 and the second TIM layer 144 are separated from each other by an air gap 143. The air gap 143 can further reduce lateral thermal interaction between the first and second semiconductor dies 120 and 122. However, in some embodiments, the first TIM layer 142 and the second TIM layer 144 can be in contact with each other, as shown in FIG. 4. In other embodiments, the first TIM layer 142 can overlap a portion of the second TIM layer 144, or vice versa, though not shown.

The first TIM layer 142 and the second TIM layer 144 of the multi-TIM structure 140a are disposed on the first and second semiconductor dies 120 and 122. In some embodiments, each of the first and second TIM layers 142 and 144 is in physical contact with the top surfaces of the first and second semiconductor dies 120 and 122. In an exemplary embodiment, the first TIM layer 142 and the second TIM layer 144 each have a thickness of between about 20 μm and about 200 μm, but the disclosure is not limited thereto.

Referring to FIGS. 2D and 3, a heat sink 150 is then disposed over the first TIM layer 120 and the second TIM layer 122 according to operation 18. Therefore, the semiconductor package structure 100a further includes the heat sink (also referred to as a lid) 150 in contact with the first TIM layer 120 and the second layer 122. The heat sink 150 may have a high thermal conductivity, for example, between approximately 200 watts per meter kelvin (W/mK) and approximately 400 W/mK or more, and may be formed using a metal, a metal alloy, graphene, carbon nanotubes (CNT), or the like. The heat sink 150 is mounted over, and thermally coupled to, the first and second semiconductor dies 120 and 122 through the multi-TIM structure 140a. The multi-TIM structure 140a not only couples the heat sink 150 to the first and second semiconductor dies 120 and 122, but also helps to dissipate the heat generated by the semiconductor dies 120 and 122 into the heat sink 150.

It is worth noting that a thermal conductivity (Tk) of the first TIM layer 142 is different from a thermal conductivity of the second TIM layer 144. For example, the thermal conductivity of the first TIM layer 142 is greater than the thermal conductivity of the second TIM layer 144. In some embodiments, the thermal conductivity of the first TIM layer 142 is greater than approximately 10 W/mK, but the disclosure is not limited thereto. In some embodiments, the thermal conductivity of the second TIM layer 144 is smaller than approximately 10 W/mK. In other embodiments, the thermal conductivity of the second TIM layer 144 is smaller than approximately 5 W/mK, but the disclosure is not limited thereto. For example, the second TIM layer 144 may be a polymer having a thermal conductivity of between approximately 3 W/mK and approximately 5 W/mK. The first TIM layer 142 may include a base material with thermal conductive fillers. In some embodiments, the base material may include one or more of plastics, adhesives, glues, epoxies, polymers, thermoplastics, silicone, grease, oil, resin, or the like. The thermal conductive fillers may increase the thermal conductivity of the first TIM layer 142 to between approximately 10 W/mK and approximately 50 W/mK or more. Applicable conductive filler materials may include aluminum oxide (AlO), boron nitride (BN), aluminum nitride (AlN), aluminum (Al), copper (Cu), silver (Ag), indium (In), a combination thereof, or the like. In other embodiments, the TIM layer 142 may include other materials such as a metallic-based or solder-based material comprising Ag, indium paste, or the like. The first TIM layer 142 having the thermal conductivity greater than 10 W/mK helps to transfer or dissipate heat more efficiently. For example, when a TIM layer having the thermal conductivity smaller than 10 W/mK is adopted over a semiconductor die (e.g. a CPU die), of which the heat output is greater than a memory die, the heat generated by the semiconductor die may not be transferred or dissipated in time, and thus the package may suffer thermomechanical stresses. As a result, cracks may occur between the semiconductor die and the heat sink or even in the semiconductor die itself.

In some embodiments, the first semiconductor die 120 includes a first heat output and the second semiconductor die 122 includes a second heat output less than the first heat output. For example, when the first semiconductor die 120 is a CPU die and the second semiconductor die 122 is a memory die, the first heat output of the first semiconductor die 120 is greater than the second heat output of the second semiconductor die 122. As mentioned above, the first area 114-1, which is defined where the heat conduction is needed, is also defined correspondingly to the first semiconductor die 120. Therefore, the first TIM layer 142 having the greater thermal conductivity disposed in the first area 114-1 is also disposed on the first semiconductor die 120 while the second TIM layer 144 having the less thermal conductivity but better adhesion is disposed on the second semiconductor die 122. Therefore, the heat generated by the first semiconductor die 120 can be more efficiently dissipated to the heat sink by the first TIM layer 142.

By adopting the multi-TIM structure 140a, the TIM layers 142 and 144 with different thermal conductivities are provided to the semiconductor dies 120 and 122 with different heat outputs. Consequently, heat dissipation efficiency is improved and made uniform, and thus warpage caused by heat can be reduced.

Figure 5:
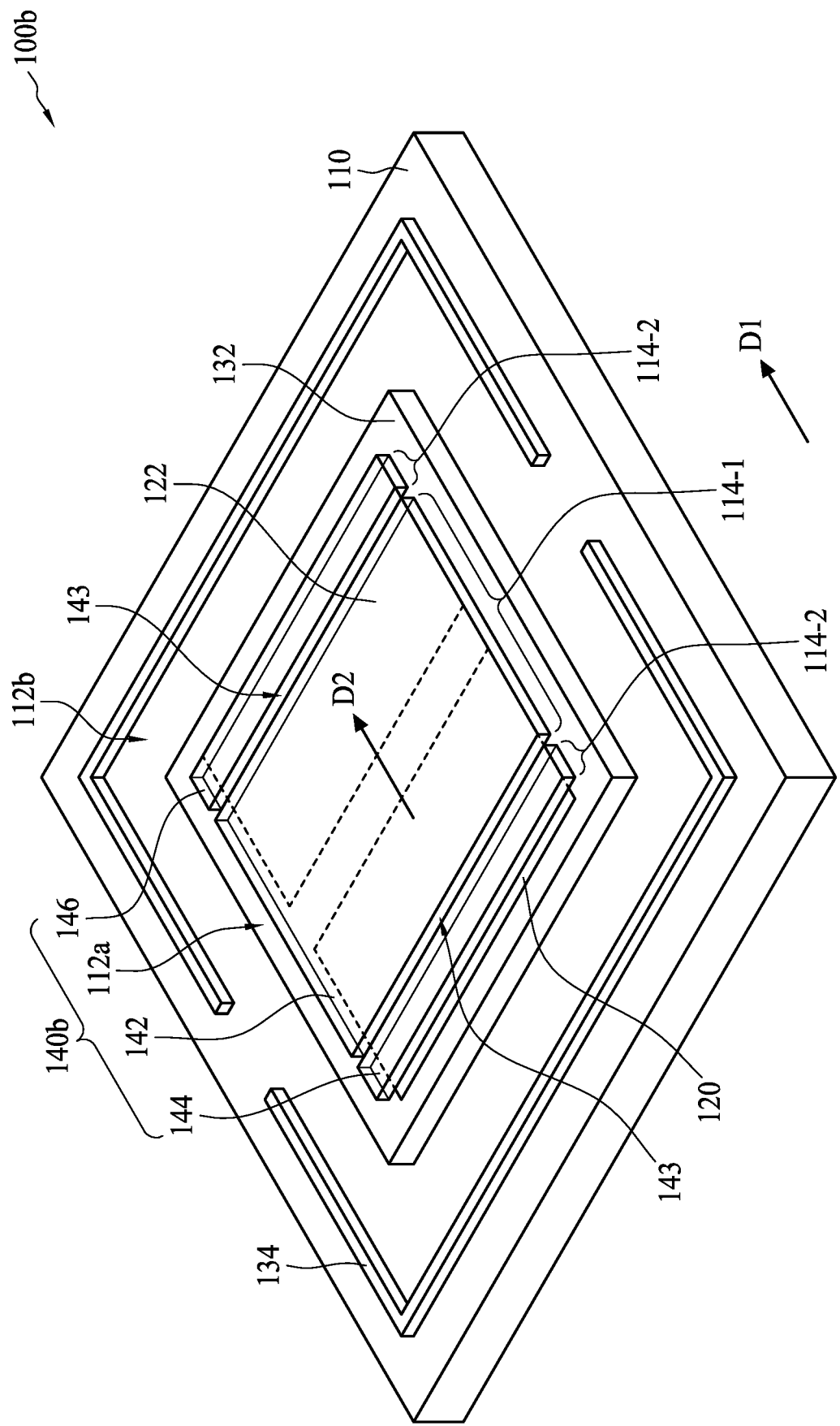
FIG. 5 is a schematic drawing illustrating a semiconductor package structure according to aspects of one or more embodiments of the present disclosure.

FIG. 5 is a schematic drawing illustrating a semiconductor package structure 100b according to aspects of one or more embodiments of the present disclosure. It should be noted that similar elements in FIG. 2C and FIG. 5 are designated by the same numerals. Further, similar elements in FIG. 2C and FIG. 5 can include similar materials and can be formed by operations 12 to 18 of the method 10; therefore, such redundant details are omitted in the interest of brevity, and only the differences are mentioned. Additionally, the heat sink 150 is omitted from FIG. 5, however those skilled in the art would easily understand the arrangement of the heat sink 150 according to the aforementioned description. In some embodiments, the difference between the semiconductor package structure 100a and the semiconductor package structure 100b is that a first area 114-1 where the heat conduction is needed is defined between two second areas 114-2 where the adhesion is needed. Further, the difference between the semiconductor package structure 100a and the semiconductor package structure 100b is that the TIM structure 140b of the semiconductor package structure 100b further includes a third TIM layer 146.

As shown in FIG. 5, the first and second semiconductor dies 120 and 122 are arranged along the first direction D1. The first area 114-1 and the second areas 114-2 are defined along a second direction D2, and the second direction D2 can be the same as the first direction D1, as shown in FIG. 5. Accordingly, the first and second semiconductor dies 120 and 122, the first TIM layer 142 disposed in the first area 114-a, and the second TIM layer 144 and the third TIM layer 146 disposed in the second areas 114-2 are arranged along a same direction D1/D2. In some embodiments, the first TIM layer 142, the second TIM layer 144 and the third TIM layer 146 are separated from each other by air gaps 143, which can further reduce lateral thermal interaction between the first and second semiconductor dies 120 and 122. However, in some embodiments, the first TIM layer 142, the second TIM layer 144 and the third TIM layer 146 can be in contact with each other. In other embodiments, the first TIM layer 142, the second TIM layer 144 and the third TIM layer 146 can overlap each other.

In some embodiments, the first TIM layer 142 is disposed in the first area 114-1, while the second TIM layer 144 and the third TIM layer 146 are disposed in the second areas 114-2. Therefore, the first TIM layer 142 is disposed between the second TIM layer 144 and the third TIM layer 146 from a top view, as shown in FIG. 5. In some embodiments, the first TIM layer 142 covers a portion of the first semiconductor die 120 and a portion of the second semiconductor die 122, while the second TIM layer 144 covers another portion of the first semiconductor die 120 and the third TIM layer 146 covers another portion of the second semiconductor die 122. In some embodiments, the second and third TIM layers 144 and 146 are disposed over at least four corners of the die region 112a, as shown in FIG. 4. Further, the second TIM layer 144 covers two corners of the first semiconductor die 120 and the third TIM layer 146 covers two corners of the second semiconductor die 122.

In some embodiments, the thermal conductivity of the first TIM layer 142 is greater than that of the second TIM layer 144. Further, the thermal conductivity of the first TIM layer 142 is also greater than a thermal conductivity of the third TIM layer 146. In some embodiments, the thermal conductivity of the third TIM layer 146 can be the same as that of the second TIM layer 144. In other embodiments, the thermal conductivities of the second and third TIM layers 144 and 146 are different from each other. It is worth noting that adhesion of the TIM material is inversely proportional to the thermal conductivity of the TIM material. Therefore, the first TIM layer 142 with the greater thermal conductivity has less adhesion. In other words, the second and third TIM layers 144 and 146 have less thermal conductivity, but greater adhesion.

As mentioned above, heat can cause thermal stress and warpage in the 3DIC package structure leading to cracks in the connectors 130. In some embodiments, warpage appears to occur at a periphery of the die, especially at the corners; therefore the second and third TIM layers 144 and 146 having the greater adhesion are disposed at the corners of the first region 112a. Accordingly, the first and second semiconductor dies 120 and 122 can be secured to the heat sink by the second and third TIM layers 144 and 146 even though warpage occurs. Meanwhile, the first TIM layer 142 with the greater thermal conductivity helps to dissipate the heat to the heat sink 150.

By adopting the multi-TIM structure 140b, the TIM layers 142 to 146 with different adhesions are provided to the different regions which are exposed to different stresses. Accordingly, heat dissipation efficiency is improved and warpage caused by heat is reduced by the first TIM layer 142, while adhesion between the first/second semiconductor dies 120/122 and the heat sink is improved by the second and third TIM layers 144 and 146.

Figure 6:
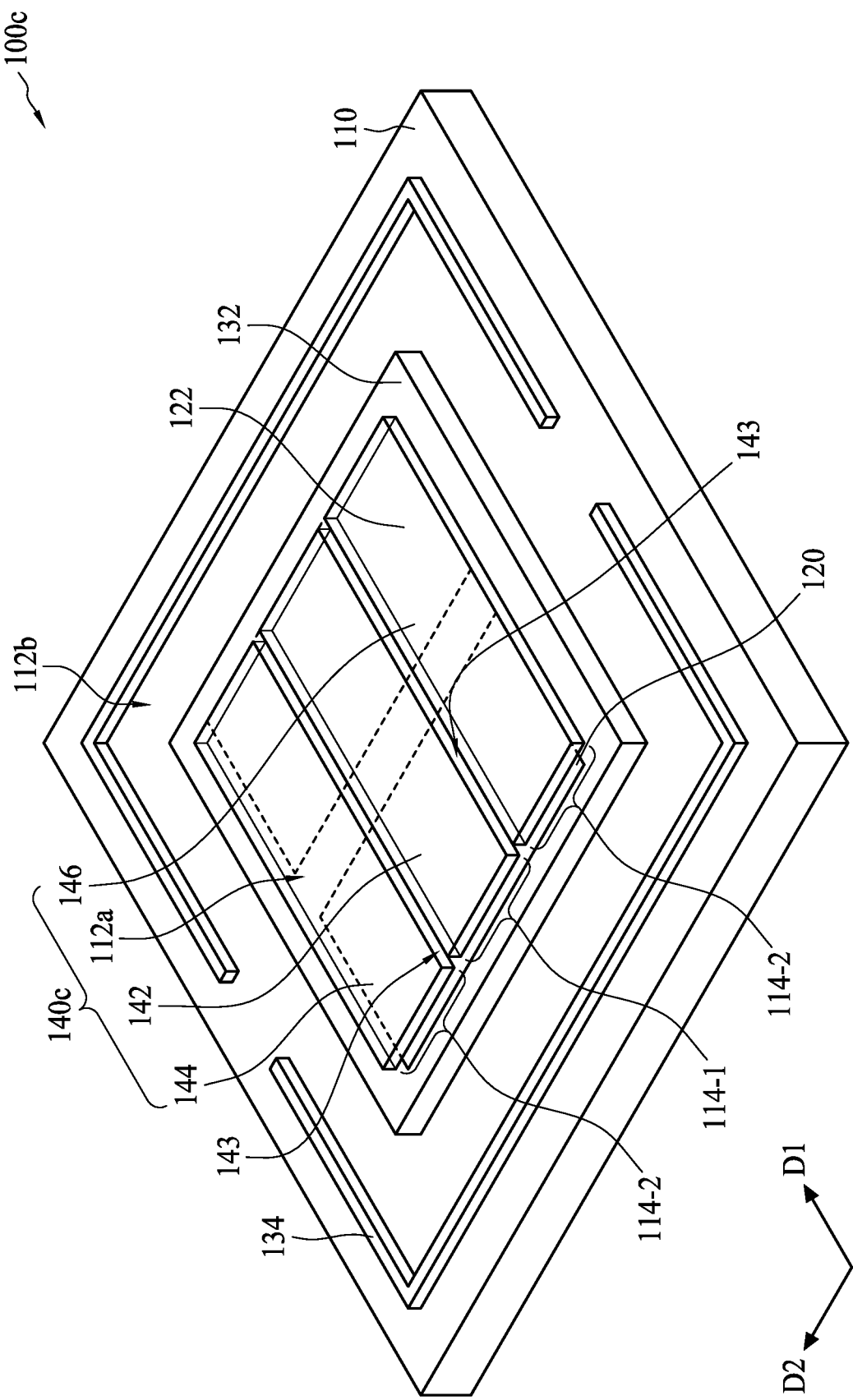
FIG. 6 is a schematic drawing illustrating a semiconductor package structure according to aspects of one or more embodiments of the present disclosure.

FIG. 6 is a schematic drawing illustrating a semiconductor package structure 100c according to aspects of one or more embodiments of the present disclosure. It should be noted that similar elements in FIGS. 5 and 6 are designated by the same numerals. Further, similar elements in FIGS. 5 and 6 can include similar materials and can be formed by operation 12 to 18 of the method 10; therefore, such redundant details are omitted in the interest of brevity, and only the differences are mentioned. Additionally, the heat sink 150 is omitted from FIG. 6, however those skilled in the art would easily understand the arrangement of the heat sink 150 according to the aforementioned description. In some embodiments, the difference between the semiconductor package structure 100b and the semiconductor package structure 100c is that the definition of the first area 114-1 and the second areas 114-2 and the arrangement of the multi-TIM structure 140c of the semiconductor package structure 100c are different from that of the multi-TIM structure 140b of the semiconductor package structure 100b.

In some embodiments, the multi-TIM structure 140c of the semiconductor package structure 100c includes the first TIM layer 142, the second TIM layer 144 and the third TIM layer 146. The first semiconductor die 120 and the second semiconductor die 122 are arranged along a first direction D1. The first area 114-1 and the second areas 114-2 are defined along a second direction D2. Therefore the first TIM layer 142, the second TIM layer 144 and the third TIM layer 146 are arranged along the second direction D2. In some embodiments, the second direction D2 is different from the first direction D1, as shown in FIG. 6. In some embodiments, the first direction D1 and the second direction D2 are perpendicular to each other, but the disclosure is not limited thereto. The first TIM layer 142 overlaps a portion of each of semiconductor dies 120 and 122, the second TIM layer 144 overlaps another portion of each of the semiconductor dies 120 and 122, and the third TIM layer 146 overlaps the other portion of each of the semiconductor dies 120 and 122, but the disclosure is not limited thereto. In some embodiments, the first TIM layer 142, the second TIM layer 144 and the third TIM layer 146 are separated from each other by air gaps 143. The air gaps 143 can further reduce lateral thermal interaction between the first and second semiconductor dies 120 and 122. However, in some embodiments, the first TIM layer 142, the second TIM layer 144 and the third TIM layer 146 can be in contact with each other. In other embodiments, the first TIM layer 142, the second TIM layer 144 and the third TIM layer 146 can overlap each other.

In some embodiments, the thermal conductivity of the first TIM layer 142 is greater than that of the second TIM layer 144. Further, the thermal conductivity of the first TIM layer 142 is also greater than a thermal conductivity of the third TIM layer 146. In some embodiments, the thermal conductivity of the third TIM layer 146 can be the same as that of the second TIM layer 144. In other embodiments, the thermal conductivities of the second and third TIM layers 144 and 146 are different from each other. It is worth noting that adhesion of the TIM material is inversely proportional to the thermal conductivity of the TIM material. Therefore, the first TIM layer 142 with the greater thermal conductivity has less adhesion. In other words, the second and third TIM layers 144 and 146 have less thermal conductivity, but greater adhesion.

As mentioned above, heat can cause thermal stress and warpage in the 3DIC package structure leading to cracks in the connectors 130. In some embodiments, warpage is observed to occur at a periphery of the die, especially at the corners. Therefore, the second and third TIM layers 144 and 146 having the greater adhesion are disposed over a periphery of the first region 112a. For example, the second and third TIM layers 144 and 146 are disposed over at least four corners of the first region 112a, as shown in FIG. 6. Further, the second TIM layer 144 covers two corners of the first semiconductor die 120 and two corners of the second semiconductor die 122, while the third TIM layer 146 covers another two corners of the first semiconductor die 120 and another two corners of the second semiconductor die 122, as shown in FIG. 6. Therefore, not only all corners of the first region 112a but also all corners of the first and second semiconductor dies 120 and 122 are secured to the heat sink by the second and third TIM layers 144 and 146. Meanwhile, the first TIM layer 142 with the higher thermal conductivity helps to dissipate the heat to the heat sink 150.

By adopting the multi-TIM structure 140c, the TIM layers 142 to 146 with different adhesions are provided to the different regions which are exposed to different stresses. Accordingly, heat dissipation efficiency is improved and warpage caused by heat is reduced by the first TIM layer 142 while adhesion between the first/second semiconductor dies 120/122 and the heat sink is improved by the second and third TIM layers 144 and 146.

Figure 7:
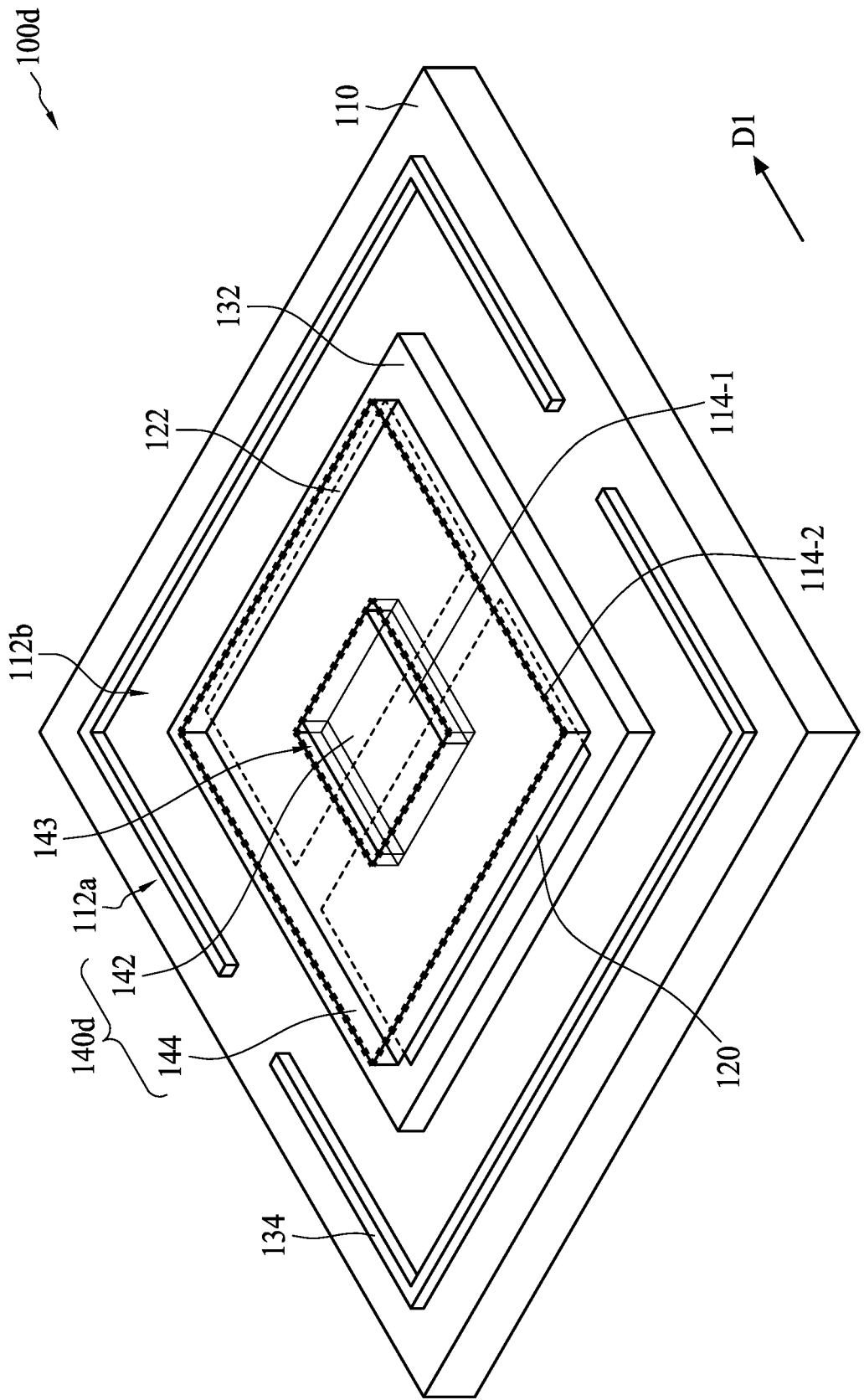
FIG. 7 is a schematic drawing illustrating another semiconductor package structure according to aspects of one or more embodiments of the present disclosure.

FIG. 7 is a schematic drawing illustrating a semiconductor package structure 100d according to aspects of one or more embodiments of the present disclosure. It should be noted that similar elements in FIG. 2C and FIG. 7 are designated by the same numerals. Further, similar elements in FIG. 2C and FIG. 7 can include similar materials and can be formed by operation 12 to 18 of the method 10; therefore, such redundant details are omitted in the interest of brevity, and only the differences are mentioned. Additionally, the heat sink 150 is omitted from FIG. 7, however those skilled in the art would easily understand the arrangement of the heat sink 150 according to the aforementioned description. In some embodiments, the difference between the semiconductor package structure 100a and the semiconductor package structure 100d is that the definition of the first area 114-1 and the second area 114-2 and the arrangement of the multi-TIM structure 140d of the semiconductor package structure 100d is different from that of the semiconductor package structure 100a. In some embodiments, the second area 114-2 is defined to surround the first area 114-1, as shown in FIG. 7. In some embodiments, the first area 114-1 is defined in a center of the die region (the first region) 112a, while the second area 114-2 is defined in a periphery of the die region 112a.

As shown in FIG. 7, the multi-TIM structure 140d of the semiconductor package structure 100d includes a first TIM layer 142 disposed in the first area 114-1 and a second TIM layer 144 disposed in the second area 114-2. However, the amount of TIM layers can be adjusted to meet different product requirements. Accordingly, the first TIM layer 142 is disposed in the center of the first region 112a and the second TIM layer 144 is disposed in the periphery of the first region 112a. As shown in FIG. 7, the second TIM layer 144 surrounds the first TIM layer 142 from a top view, but the disclosure is not limited thereto. Further, the second TIM layer 144 covers not only the corners of the first region 112a, but also the entire periphery of the first region 112a, as shown in FIG. 7. In some embodiments, the first TIM layer 142 and the second TIM layer 144 are separated from each other by an air gap 143. However, in some embodiments, the first TIM layer 142 and the second TIM layer 144 can be in contact with each other. In other embodiments, the first TIM layer 142 can overlap a portion of the second TIM layer 144, or vice versa, though not shown.

In some embodiments, the thermal conductivity of the first TIM layer 142 is greater than that of the second TIM layer 144. Thus, the first TIM layer 142 located in the center of the first region 112a is used to dissipate heat into the heat sink. As mentioned above, adhesion of the TIM material is inversely proportional to the thermal conductivity of the TIM material; therefore, the first TIM layer 142 with the greater thermal conductivity has less adhesion. In other words, the second TIM layer 144 has less thermal conductivity, but greater adhesion. In some embodiments, the second TIM layer 144 is disposed over a periphery of the first region 112a. Therefore, the first and second semiconductor dies 120 and 122 can be secured to the heat sink 150 even though warpage occurs.

By adopting the multi-TIM structure 140d, the TIM layers 142 and 144 with different adhesions are provided to the different regions which are exposed to different stresses. Accordingly, heat dissipation efficiency is improved and warpage is reduced by the first TIM layer 142 while adhesion between the first/second semiconductor dies 120/122 and the heat sink is improved by the second TIM layer 144.

Figure 8:
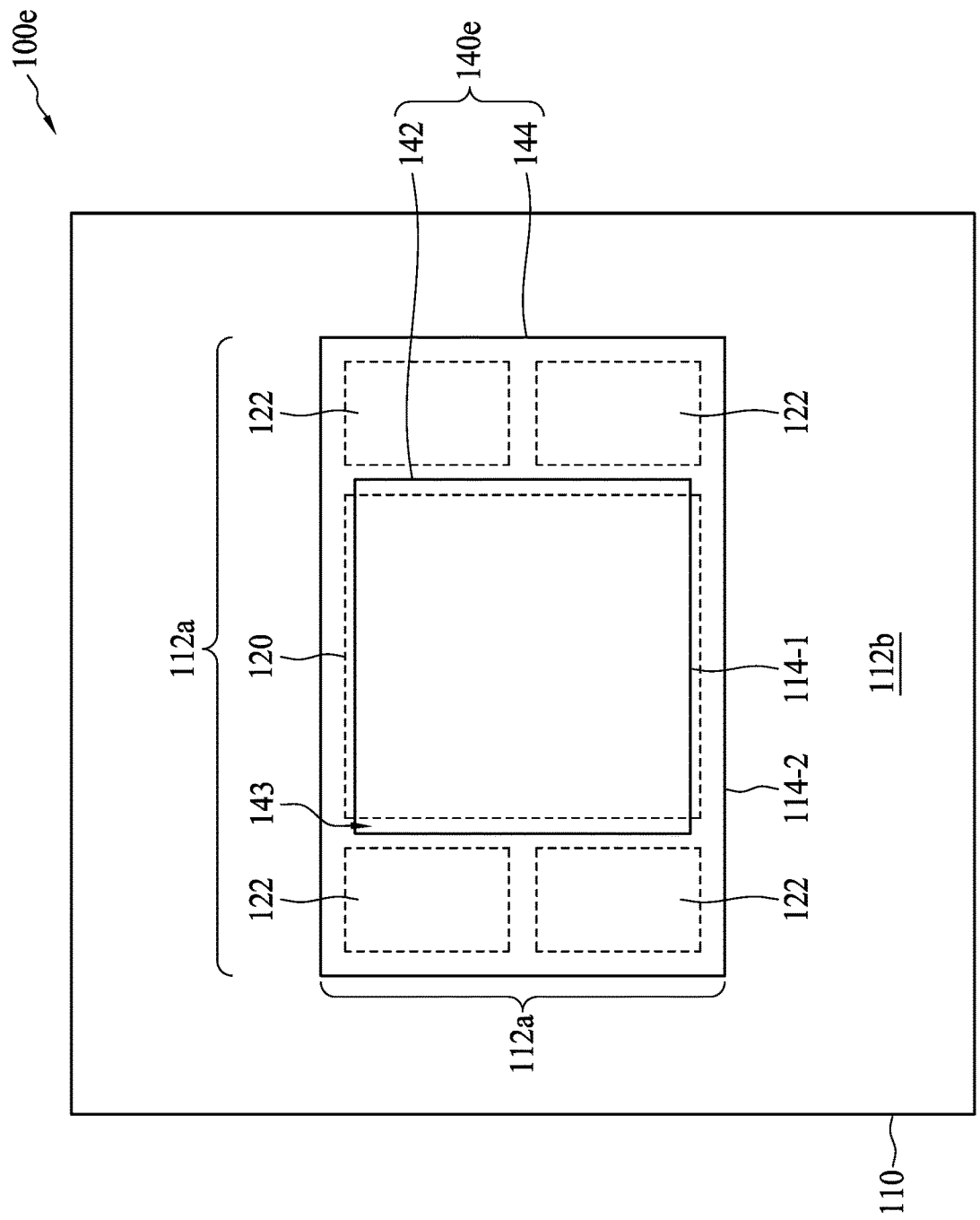
FIG. 8 is a schematic drawing illustrating another semiconductor package structure according to aspects of one or more embodiments of the present disclosure.

FIG. 8 is a schematic drawing illustrating a semiconductor package structure 100e according to aspects of one or more embodiments of the present disclosure. It should be noted that similar elements in FIGS. 7 and 8 are designated by the same numerals. Further, similar elements in FIGS. 7 and 8 can include similar materials and can be formed by operation 12 to 18 of the method 10; therefore, in the interest of brevity, only the differences are mentioned. In some embodiments, the difference between the semiconductor package structure 100d and the semiconductor package structure 100e is that definition of the first area 114-1 and the second area 114-2 and the arrangement of the multi-TIM structure 140e of the semiconductor package structure 100e. As shown in FIG. 8, the second area 114-2 surrounds the first area 114-1. In some embodiments, the first area 114-1 is defined in a center of the die region (the first region) 112a, while the second area 114-2 is defined in a periphery of the die region 112a. Further, the first area 114-1 is defined correspondingly to the first semiconductor die 120, as shown in FIG. 8. Additionally, the heat sink 150 is omitted from FIG. 8; however, those skilled in the art would easily understand the arrangement of the heat sink 150 according to the aforementioned description. In some embodiments, the semiconductor package structure 100e includes a plurality of semiconductor dies. For example, the semiconductor package structure 100e includes at least a first semiconductor die 120 such as a CPU die, and a plurality of second semiconductor dies 122 such as HBM dies. The first semiconductor die 120 and the second semiconductor dies 122 are disposed in the first region 112a of the substrate 110. In some embodiments, the second semiconductor dies 122 are disposed at two sides of the first semiconductor die 120 from a top view, as shown in FIG. 8, but the disclosure is not limited thereto. The first semiconductor die 120 can include a first heat output and the second semiconductor dies 122 can include a second heat output. As mentioned above, the first heat output of the first semiconductor die 120 (i.e., the CPU die) is greater than the second heat output of the second semiconductor dies 122 (i.e., the HBM dies).

Still referring to FIG. 8, the multi-TIM structure 140e of the semiconductor package structure 100e includes a first TIM layer 142 and a second TIM layer 144. However, the amount of TIM layers can be adjusted to meet different product requirements. In some embodiments, the first TIM layer 142 is disposed in the first area 114-1 in the center of the first region 112a and the second TIM layer 144 is disposed in the second area 114-2 in the periphery of the first region 112a to surround the first TIM layer 142 from a top view. Further, the first TIM layer 142 in the first area 114-1 covers the first semiconductor die 120 while the second TIM layer 144 in the second area 114-2 covers the second semiconductor dies 122, as shown in FIG. 8. In some embodiments, the second TIM layer 144 covers corners of the first semiconductor die 120 and corners of the second semiconductor dies 122, but the disclosure is not limited thereto. In some embodiments, the first TIM layer 142 and the second TIM layer 144 are separated from each other by an air gap 143. However, in some embodiments, the first TIM layer 142 and the second TIM layer 144 can be contact in with each other. In other embodiments, the first TIM layer 142 can overlap a portion of the second TIM layer 144, or vice versa, though not shown.

In some embodiments, the thermal conductivity of the first TIM layer 142 is greater than that of the second TIM layer 144. Thus, the first TIM layer 142 disposed over the first semiconductor die 122, which has the greater heat output, is used to dissipate more heat into the heat sink. As mentioned above, adhesion of the TIM material is inversely proportional to the thermal conductivity of the TIM material. Therefore, the first TIM layer 142 with the greater thermal conductivity has less adhesion. In other words, the second TIM layer 144 has less thermal conductivity, but greater adhesion. As shown in FIG. 8, the second TIM layer 144 is disposed over the periphery of the first region 112a, which is exposed to greater stress. Since the second heat output of the second semiconductor dies 122 is less than the first heat output, the second TIM layer 144 has sufficient thermal conductivity to dissipate the heat into the heat sink while meeting the adhesion requirements in the periphery. Accordingly, the first semiconductor die 120 and the second semiconductor dies 122 can be secured to the heat sink by the second TIM layer 144 even though warpage occurs.

By adopting the multi-TIM structure 140e, the TIM layers 142 and 144 with different thermal conductivities are provided to the semiconductor dies 120 and 122 with different heat outputs. Accordingly, heat dissipation efficiency is improved and made uniform, and thus warpage is reduced by the first TIM layer 142. Further, the TIM layers 142 and 144 with different adhesions are provided to the different regions which are exposed to different stresses. Accordingly, adhesion between the first/second semiconductor dies 120/122 and the heat sink is improved by the second TIM layer 144.

The present disclosure therefore provides a semiconductor package structure including a multi-TIM structure. In some embodiments, the multi-TIM structure includes at least two TIM layers with different thermal conductivities and adhesions. In some embodiments, the multi-TIM structure includes different TIM layers depending on the stress applied to the semiconductor package structure. For example, the multi-TIM structure may include a TIM layer having greater adhesion in regions exposed to greater stress and another TIM layer having less adhesion in other regions receiving less stress. In some embodiments, the multi-TIM structure includes different TIM layers depending on heat generated during operation. For example, the multi-TIM structure may include a TIM layer having greater thermal conductivity in regions accommodating dies generating more heat and another TIM layer having less thermal conductivity in regions accommodating dies generating less heat.

The present disclosure provides a method for forming a semiconductor package structure is provided. The method includes following operations. A substrate including a die region and a first semiconductor die and a second semiconductor die disposed in the die region is received. A first area where heat conduction is needed and a second area where adhesion is needed are defined in the die region. A first TIM layer is disposed in the first area and a second TIM layer is disposed in the second area. In some embodiments, a thermal conductivity of the first TIM layer is greater than a thermal conductivity of the second TIM layer, and an adhesion of the second TIM layer is greater than an adhesion of the first TIM layer.

In some embodiments, a method for forming a semiconductor package structure is provided. The method includes following operations. A substrate is provided. A first semiconductor die and a second semiconductor die are disposed over the substrate, wherein the first semiconductor die includes a first heat output and the second semiconductor die includes a second heat output less than the first heat output. A multi-TIM structure is disposed over the first semiconductor die and the second semiconductor die, wherein the multi-TIM structure includes a first TIM layer and a second TIM layer. In some embodiments, a thermal conductivity of the first TIM layer is different from a thermal conductivity of the second TIM layer.

In some embodiments, a method for forming a semiconductor package structure is provided. The method includes following operations. A substrate including a die region and a plurality of semiconductor dies disposed in the die region is received. A multi-TIM structure is disposed over the plurality of semiconductor dies in the die region. In some embodiments, the multi-TIM structure includes at least a first TIM layer and at least a second TIM layer, wherein an adhesion of the first TIM layer is different from an adhesion of the second TIM layer. The second TIM layer is disposed over corners of the die region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor package structure comprising:
   receiving a substrate comprising a die region and a first semiconductor die and a second semiconductor die disposed in the die region;
   defining a first area where heat conduction is needed and a second area where adhesion is needed in the die region; and
   disposing a first thermal interface material (TIM) layer in the first area and disposing a second TIM layer in the second area,
   wherein a thermal conductivity (Tk) of the first TIM layer is greater than a thermal conductivity of the second TIM layer, and an adhesion of the second TIM layer is greater than an adhesion of the first TIM layer, wherein the second TIM layer surrounds the first TIM layer and in contact with four sides of the first TIM layer.

2. The method of claim 1, wherein the second area surrounds the first area.

3. The method of claim 1, wherein the first semiconductor die includes a first heat output, the second semiconductor die includes a second heat output less than the first heat output, and the first area is defined corresponding to the first semiconductor die.

4. The method of claim 1, further comprising disposing a heat sink over the first TIM layer and the second TIM layer, wherein the heat sink is in contact with the first TIM layer and the second TIM layer.

5. The method of claim 1, wherein a thickness of the first TIM layer is substantially the same as a thickness of the second TIM layer.

6. The method of claim 1, wherein the second TIM layer covers corners of the first semiconductor die.

7. The method of claim 1, wherein the first semiconductor die and the second semiconductor die are separated from each other.

8. The method of claim 1, further comprising dispensing an underfill into a space between the substrate, the first semiconductor die and the second semiconductor die.

9. A method for forming a semiconductor package structure comprising:
   providing a substrate;
   disposing a first semiconductor die and a second semiconductor die over the substrate, wherein the first semiconductor die includes a first heat output and the second semiconductor die includes a second heat output less than the first heat output; and
   disposing a multi-TIM structure over the first semiconductor die and the second semiconductor die, wherein the multi-TIM structure comprises a first TIM layer and a second TIM layer having a rectangular shape, and the second TIM layer covers corners of the first semiconductor die and corners of the second semiconductor die, the second TIM layer surrounds the first TIM layer and is in contact with four sides of the first TIM layer, wherein a thermal conductivity of the first TIM layer is different from a thermal conductivity of the second TIM layer.

10. The method of claim 9, further comprising disposing the first TIM layer over at least a portion of the first semiconductor die.

11. The method of claim 9, further comprising disposing a third semiconductor die over the substrate, wherein the second semiconductor die and the third semiconductor die are disposed at two sides of the first semiconductor die.

12. The method of claim 11, further comprising disposing the second TIM layer over the second semiconductor die and the third semiconductor die.

13. The method of claim 12, wherein the second TIM layer covers both the second semiconductor die and the third semiconductor die.

14. The method of claim 12, wherein the second TIM layer includes a first segment of the second TIM layer over the second semiconductor die and a second segment of the second TIM layer over the third semiconductor die.

15. A method for forming a semiconductor package structure comprising:
receiving a substrate comprising a die region and a plurality of semiconductor dies disposed in the die region, wherein the plurality of semiconductor dies includes a first semiconductor die;
forming a multi-TIM structure over the plurality of semiconductor dies in the die region, the multi-TIM structure comprising at least a first TIM layer and at least a second TIM layer, wherein an adhesion of the first TIM layer is different from an adhesion of the second TIM layer; and
disposing the first TIM layer over the die region and disposing the second TIM layer over corners of the die region, wherein a first portion of an upper surface of the first semiconductor die is covered by the first TIM layer, and a second portion of the upper surface of the first semiconductor die is covered by the second TIM layer,
wherein the first TIM layer is enclosed within the second TIM layer, and the second TIM layer is in contact with four sides of the first TIM layer.

16. The method of claim 15, wherein the second TIM layer further covers a periphery of the die region.

17. The method of claim 15, wherein the adhesion of the first TIM layer is less than the adhesion of the second TIM layer.

18. The method of claim 15, wherein the second TIM layer further covers corners of the plurality of semiconductor dies.

19. The method of claim 15, wherein the first TIM layer covers a center of the die region.

20. The method of claim 15, further comprising dispensing an underfill into a space between the substrate and the plurality of semiconductor dies.

* * * * *